United States Patent
Kang et al.

(10) Patent No.: US 7,508,061 B2
(45) Date of Patent: Mar. 24, 2009

(54) THREE-DIMENSIONAL SEMICONDUCTOR MODULE HAVING MULTI-SIDED GROUND BLOCK

(75) Inventors: Sun-Won Kang, Seoul (KR); Seung-Duk Baek, Gyeonggi-do (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 272 days.

(21) Appl. No.: 11/369,444

(22) Filed: Mar. 6, 2006

(65) Prior Publication Data
US 2007/0001282 A1    Jan. 4, 2007

(30) Foreign Application Priority Data
Jul. 1, 2005    (KR) .................. 10-2005-0059178

(51) Int. Cl.
*H01L 23/52* (2006.01)
(52) U.S. Cl. .............................. 257/692; 257/E23.079; 257/E23.07; 257/E23.099; 257/E23.105; 257/E23.172; 257/E23.177; 257/E25.01; 257/685; 257/686; 257/691; 257/696; 257/698; 257/668
(58) Field of Classification Search ................ 257/692, 257/777, 685, 686, 723, 778, 730, E23.079, 257/E23.07, E23.099, E23.105, E23.172, 257/E23.177, E25.01, 691, 696, 698, 668
See application file for complete search history.

(56) References Cited

U.S. PATENT DOCUMENTS 6,452,217 B1 *   9/2002  Wojnarowski et al.  ........ 257/99
6,605,869 B2 *   8/2003  Kimura ....................... 257/723
6,707,160 B2     3/2004  Yamaji
6,918,297 B2 *   7/2005  MacGugan .................. 257/416
2006/0035481 A1* 2/2006  Petersen et al. ............... 439/65
2006/0273439 A1* 12/2006 Hsu et al. .................... 257/686

FOREIGN PATENT DOCUMENTS

JP      11-097814       4/1999
JP      2001-352032     12/2001
KR      2000-0008962    5/2000

OTHER PUBLICATIONS

English language abstract of Korean Publication No. 2000-0008962.
English language abstract of Japanese Publication No. 11-097814.
English language abstract of Japanese Publication No. 2001-352032.

* cited by examiner

*Primary Examiner*—Alexander O Williams
(74) *Attorney, Agent, or Firm*—Marger Johnson & McCollom, P.C.

(57) ABSTRACT

The present invention relates to a three-dimensional semiconductor module having at least one unit semiconductor device connected to the outer-facing side surfaces of a multi-side ground block. The unit semiconductor device has a structure in which a semiconductor package (or semiconductor chip) is mounted on a unit wiring substrate. Ground pads to be connected to the outer-facing side surfaces of the ground block are formed on the first surface of the unit wiring substrate, the semiconductor chip is mounted on the second surface opposite to the first surface, and contact terminals electrically connected to the semiconductor chip are formed on the second surface.

33 Claims, 14 Drawing Sheets

THREE-DIMENSIONAL SEMICONDUCTOR MODULE HAVING MULTI-SIDED GROUND BLOCK

CROSS REFERENCE TO RELATED APPLICATIONS

This U.S. non-provisional application claims priority from Korean Patent Application No. 2005-59178, filed Jul. 1, 2005, the contents of which are incorporated by reference.

BACKGROUND

1. Field of the Invention

This disclosure relates to a semiconductor module.

2. Description of the Prior Art

A system is configured in various electronic instruments by combining semiconductor modules having a plurality of semiconductor packages (or semiconductor chips) mounted on a printed circuit board.

As shown in FIG. 1, a conventional semiconductor module 10 has a plurality of semiconductor packages 30 mounted on at least one surface of a printed circuit board 20 with a flat shape. The semiconductor packages 30 are electrically connected by a wiring pattern on the printed circuit board 20. Contact terminals 24 are disposed along a long side of the printed circuit board 20 and are connected to a socket in an electronic instrument (not shown), thereby connecting the electronic instrument and the semiconductor packages. The socket is fabricated to have a length corresponding to the length of a long side of the printed circuit board 20 so that the printed circuit board 20 is inserted into and electrically connected to the socket.

Because the semiconductor packages 30 are two-dimensionally mounted, e.g., in co-planar relation, on the flat printed circuit board 20, the area of the printed circuit board 20 is increased in proportion to the number of mounted semiconductor packages 30. Accordingly, miniaturization is made difficult in the case of the semiconductor module 10 using the flat, e.g., planar, printed circuit board 20.

The length of the socket in an electronic instrument should also be increased when the length of the printed circuit board 20 is increased. Therefore, this acts as a limiting factor in the design of a motherboard in the electronic instrument and causes difficulties in the arrangement and wiring of other electronic parts.

As disclosed in U.S. Pat. No. 6,707,160, a three-dimensional semiconductor module utilizing a hollow cylindrical substrate carries wiring patterns. In addition, a central reinforcing body lies within the cylindrical substrate, but is composed of non-conductive insulating material and carries no signals. The three-dimensional semiconductor module has a structure in which at least one semiconductor chip is bent on the circumferential surface of the cylindrical substrate and connected thereto by bumps. For this, a surface of the semiconductor chip corresponding to the circumferential surface of the cylindrical substrate and carrying the bumps is bent in a concave shape.

Accordingly, the above three-dimensional semiconductor module has an advantage that the mounting area of the semiconductor module may be reduced. However, electrical characteristics may deteriorate because a stable grounding path is not easily secured. Thus, while in the above three-dimensional semiconductor module semiconductor chips mount around the cylindrical substrate in a relatively high mounting density, a stable grounding path and grounding area is not readily secured. More particularly, the grounding path is formed only through circuit wirings placed on the cylindrical substrate.

Furthermore, the manufacturing process of the three-dimensional semiconductor module is more complex than that of a conventional semiconductor module. To fabricate. the cylindrical substrate, a plate-shaped board is fabricated and subsequently bent in a cylindrical form, or the bent board is attached to the cylindrical reinforcing body. The plate-shaped semiconductor chip is fabricated and subsequently bent in shape corresponding to the curvature of the cylindrical substrate. The semiconductor chip may be broken in the case that stress is excessively concentrated in the central part of the semiconductor chip during the fabrication process, e.g., when bending semiconductor chip.

Also, the bent semiconductor chip shows a tendency to return to its original flat plate-shaped form. The shape-restoration energy increases especially near the edges of the semiconductor chip, and thereby deteriorates the ability of the bumps to couple to the cylindrical substrate.

As noted, when the semiconductor chip is bent the surface thereof formed with bumps is bent in a concave shape. As a result, the pitch of the bump patterns in the bent-shape form of the semiconductor chip is smaller than those in the plate-shaped form of semiconductor chip. Accordingly, electrical short circuits may occur between the bumps of the bent-shaped form of the semiconductor chips during the mounting of the bent-form semiconductor chips upon the cylindrical substrate.

Problems caused by heat generation may also occur. Because a plurality of the bent semiconductor chips are mounted around the cylindrical substrate, having insulating properties. The mounting density and corresponding heat concentration is high while the capability of heat dissipation decreases. As a result, the performance of the three-dimensional semiconductor module may be reduced, e.g., due to the reinforcing body having insulating properties.

SUMMARY

A multisided electrically conductive ground block carries a semiconductor device about its outer-facing side surfaces to establish a support and a ground path for the semiconductor device and thereby form a three-dimensional semiconductor module.

DETAILED DESCRIPTION

Hereinafter, example embodiments of the present invention will be described with reference to the accompanying drawings.

EXAMPLE 1

Figure 1:
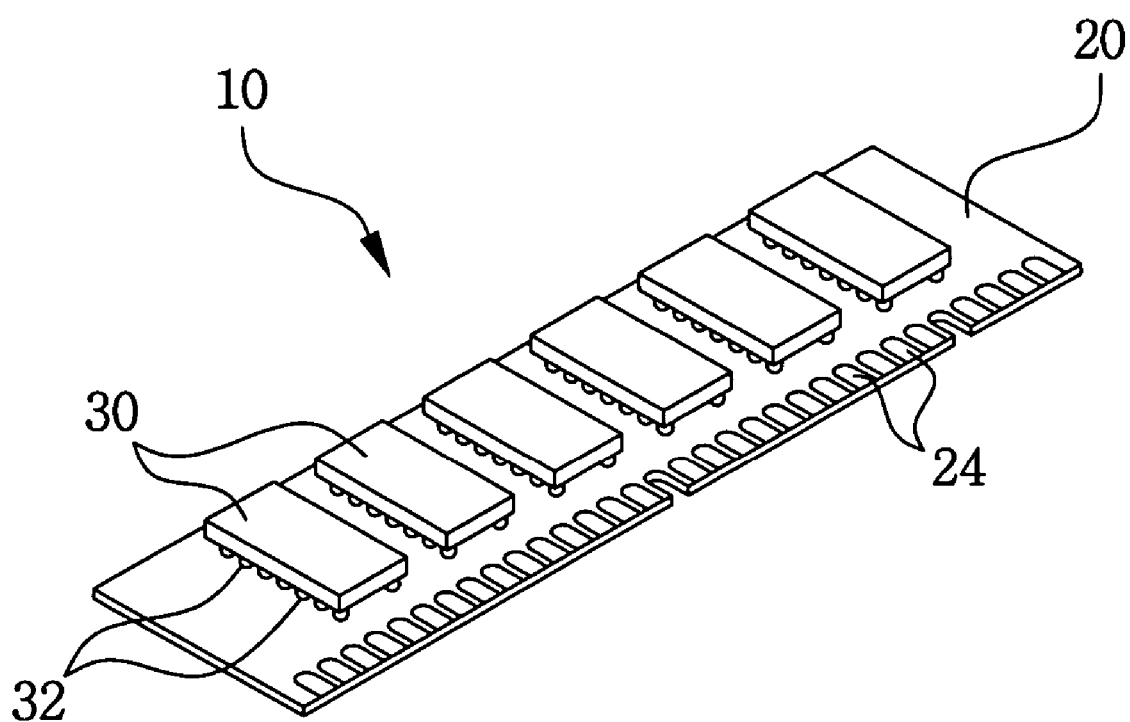
FIG. 1 (Prior Art) is a perspective view showing a semiconductor module according to the prior art.
Figure 2:
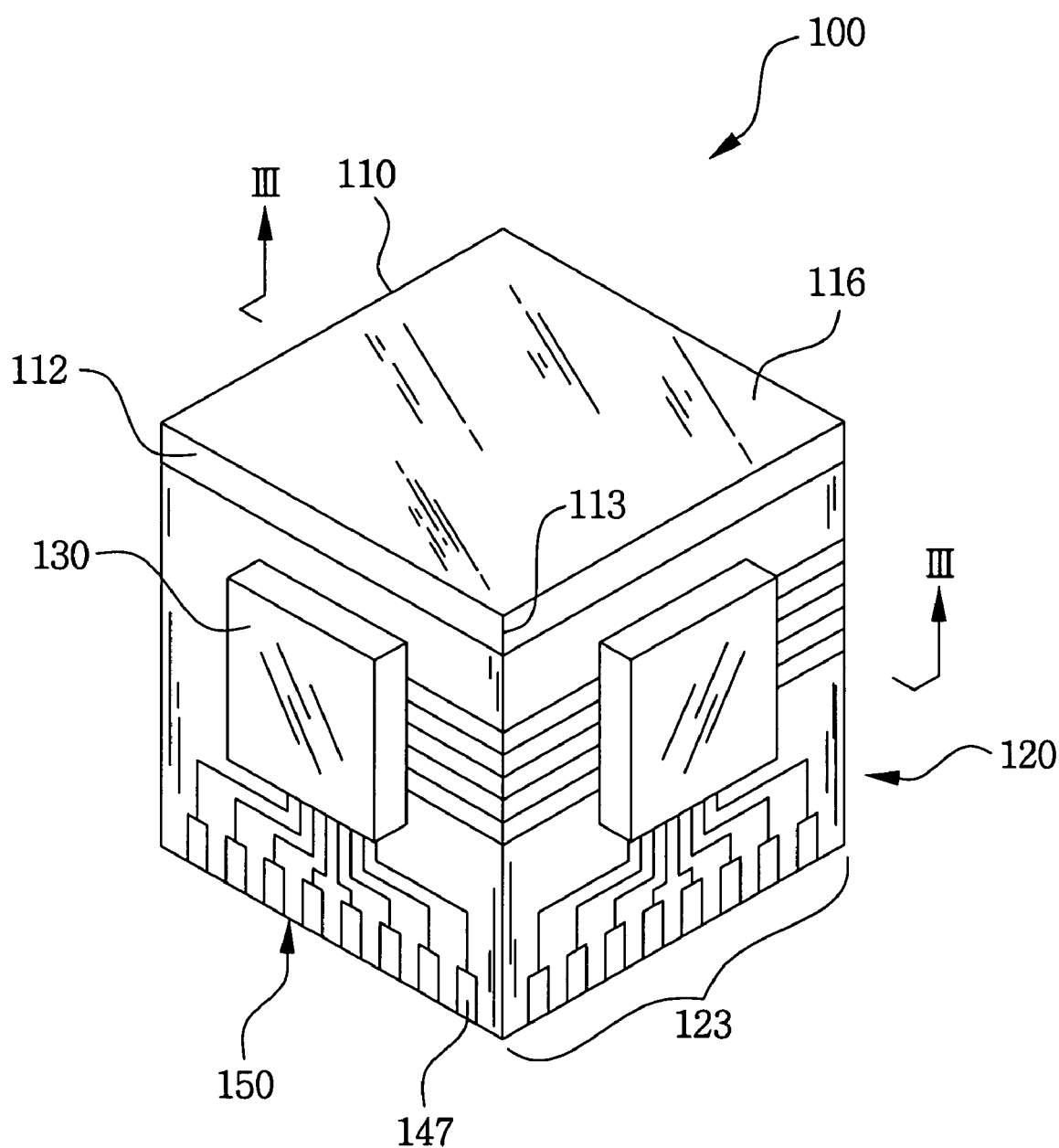
FIG. 2 is a perspective view showing a three-dimensional semiconductor module having a ground block, according to an Example 1 embodiment of the present invention.
Figure 3A:
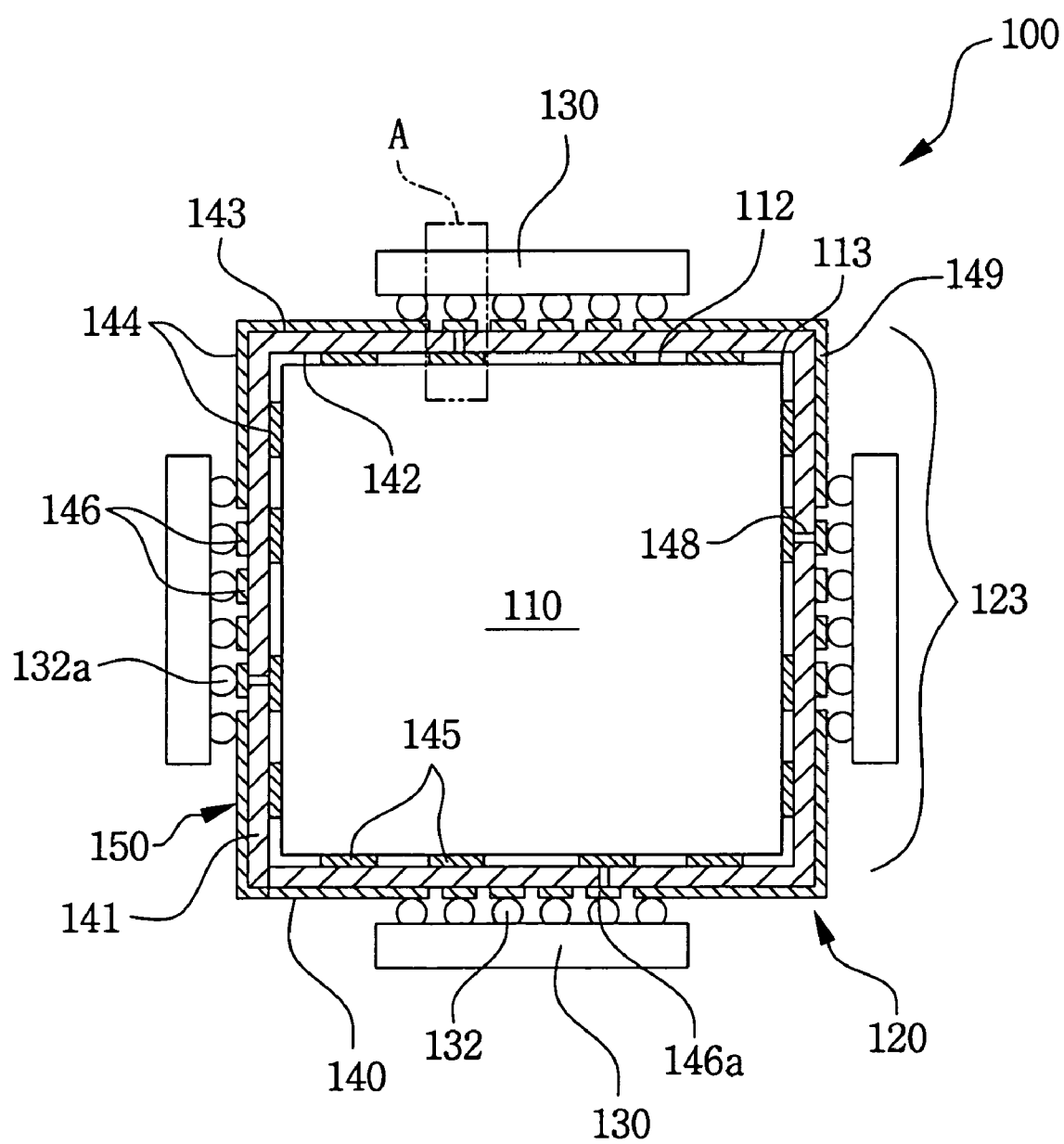
FIG. 3A is a sectional view taken along line III-III of FIG. 2.

FIG. 2 is a perspective view showing a three-dimensional semiconductor module 100 having a multisided ground block 110 according to an embodiment of the present invention (Example 1). As discussed more fully hereafter, the ground block 110 may include outer-facing surfaces each carrying a unit portion of a semiconductor device, thereby establishing module 100 as a three-dimensional semiconductor module. FIG. 3A is a sectional view taken along the line III-III of FIG. 2.

Figure 3B:
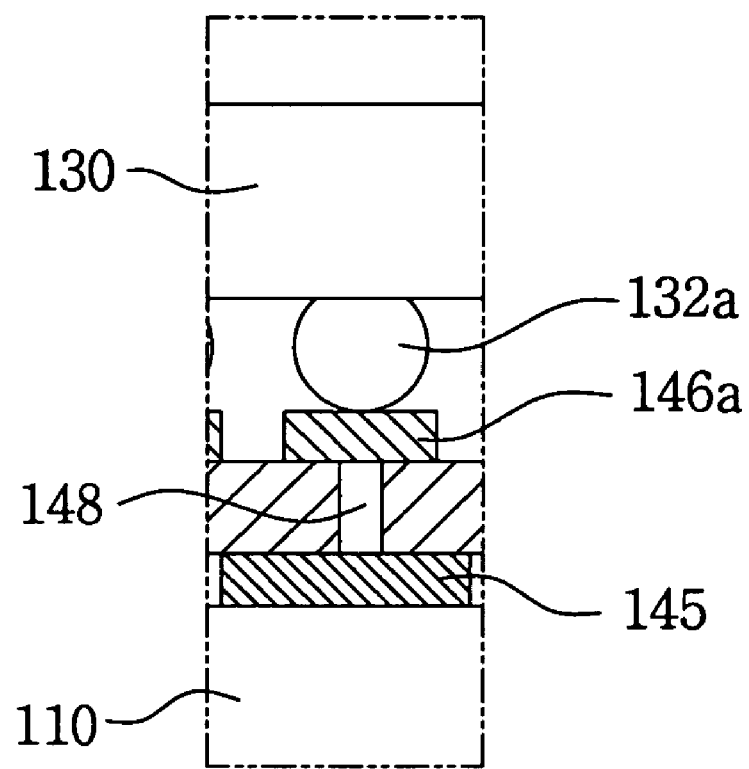
FIG. 3B is an enlarged view of the portion "A" of FIG. 3A.
Figure 4:
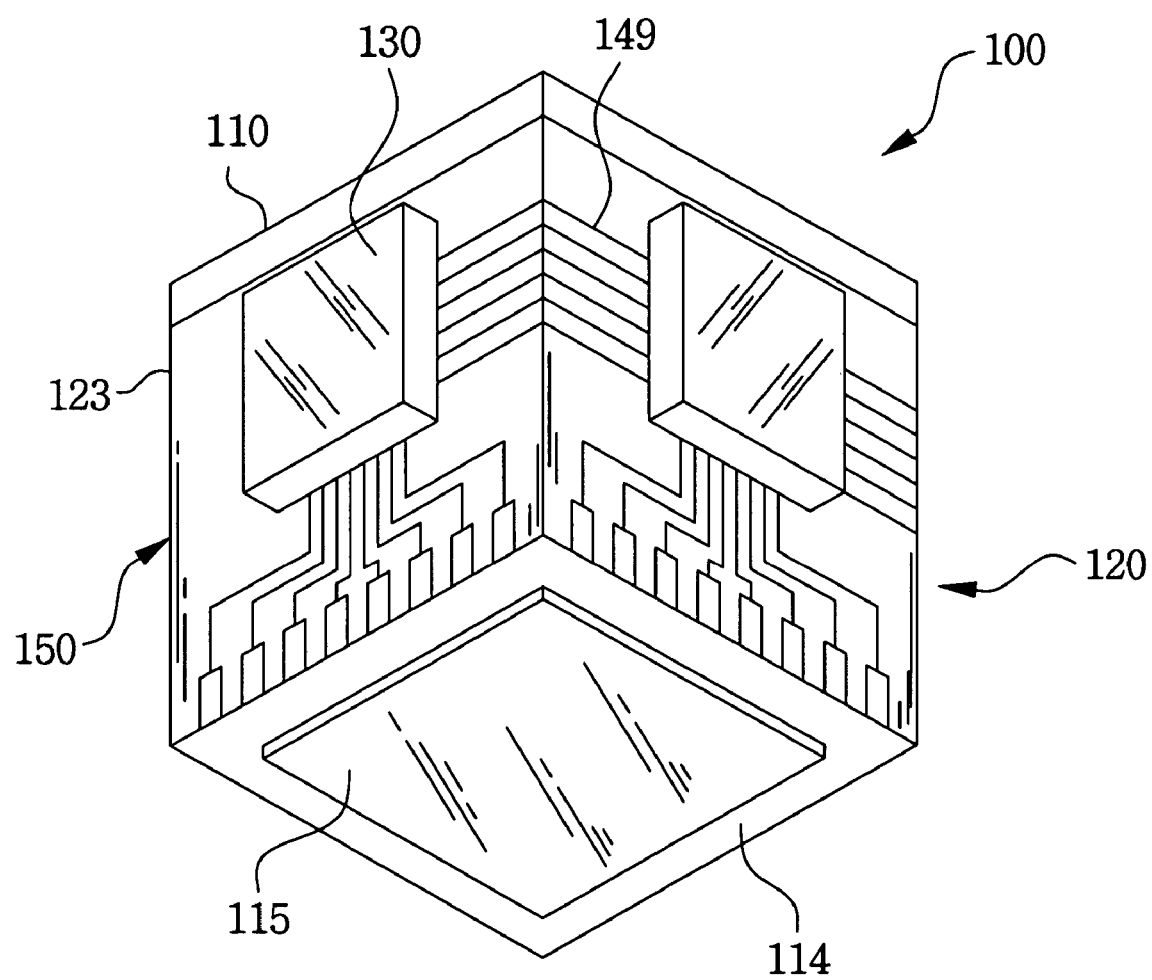
FIG. 4 is a perspective view showing the bottom of the three-dimensional semiconductor module of FIG. 2.
Figure 5A:
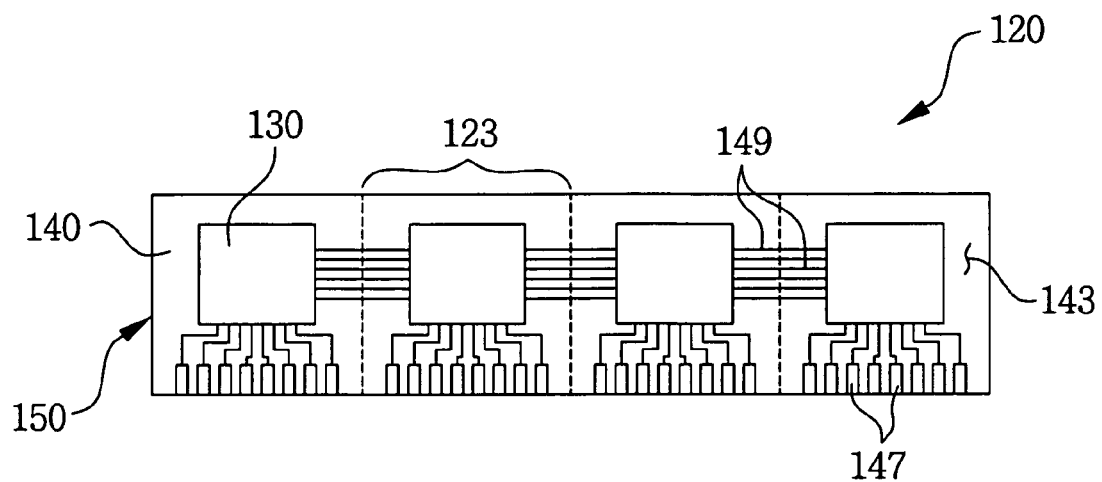
FIG. 5A is a plan view showing the state at which semiconductor packages are mounted on the upper surface of the wiring substrate of FIG. 2.
Figure 5B:
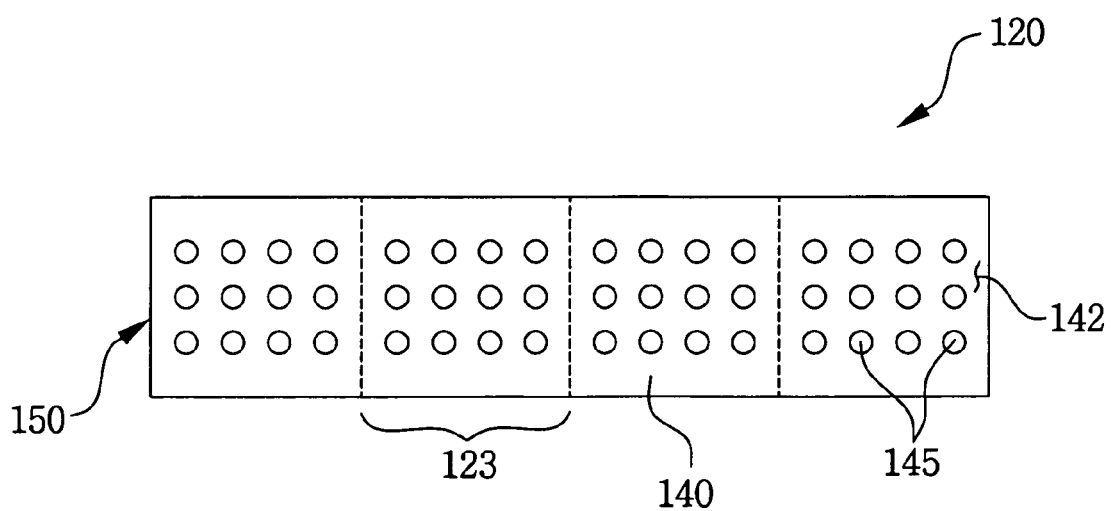
FIG. 5B is a view of the opposite side of the wiring substrate of FIG. 5A.

FIG. 3B is an enlarged view of the portion "A" of FIG. 3A. FIG. 4 is a perspective view showing the bottom of the three-dimensional semiconductor module 100 of FIG. 2. FIGS. 5A and 5B are plan views showing the semiconductor device 120 of FIG. 2.

Referring to FIGS. 2 to 5B, the three-dimensional semiconductor module 100 includes a tetragonal pillar ground block 110 and a semiconductor device 120 connected and grounded to the outer-facing side surfaces 112 of the ground block 110. Generally, a ground block according to certain embodiments of the present invention provides a pillar or support structure for a semiconductor device mounted thereabout and provides a ground path therethrough. Thus, the semiconductor device 120 is disposed at a location corresponding to the outer-facing side surfaces 112 of the ground block 110 and includes unit semiconductor devices 123 each having contact terminals 147 for external connection, e.g., arrayed at the lower side near the bottom surface 114 of the ground block 110.

The ground block of the three-dimensional semiconductor module 100 according to the Example 1 embodiment of the present invention may improve electrical characteristics by improving noise characteristics. More particularly, the ground block 110 provides a stable grounding path relative to the unit semiconductor devices 123, e.g., as grounded to the outer-facing side surfaces 112 of the ground block 110. The three-dimensional semiconductor module 100 may be configured without need to bend the semiconductor packages 130, because each semiconductor package 130 is connected to a substantially planar outer-facing side surface 112 of the ground block 110. Also, heat dissipation characteristics of the three-dimensional semiconductor module 100 may be improved because the ground block 110 provides a heat dissipation path relative to the semiconductor device 120.

Hereinafter, the three-dimensional semiconductor module 100 according to the Example 1 embodiment of the present invention will be explained in more detail.

The ground block 110 has a section of tetragonal pillar shape, and comprises a bottom surface 114, an upper surface 116 corresponding to the bottom surface 114, and four outer-facing side surfaces 112 surrounding the edges of the bottom surface 114 and upper surface 116. The ground block 110 is preferably fabricated with a metal material having good electrical and thermal conductivity to establish good grounding and heat dissipation properties. A ground terminal 115, e.g., for external connection, may be formed on the bottom surface 114 of the ground block 110. A protection layer may be formed on the surfaces of the ground block 110 to prevent corrosion and oxidation of the ground block 110.

The ground terminal 115 is disclosed as a flat or plate shape. However, a plurality of ground terminals may be arrayed on the bottom surface 114 of the ground block 110. For example, the ground terminals may be formed in a type of Land Grid Array, Ball Grid Array, Pin Grid Array, or other suitable connection methods.

The semiconductor device 120 may include several, e.g., four, unit semiconductor devices 123 each mounted on one of the four outer-facing side surfaces 112 of the ground block 110. The unit semiconductor device 123 has a structure in which a semiconductor package 130 is mounted on a unit wiring substrate 140. The ground block 110 has outer-facing side surfaces 112 larger than the mounting area of the corresponding semiconductor package 130. Accordingly, the semiconductor package 130 is disposed on the outer-facing side surface 112 of the ground block 110 without bending. Hereinafter, the wiring substrate 140 of the unit semiconductor device 123 is called a unit wiring substrate and the unit wiring substrates as a whole are called a wiring substrate 150.

Although embodiments of the present invention disclose the semiconductor package 130 as a ball grid array type formed with bumps 132 on its bottom surface as an example, the present invention is not limited thereto. A variety of surface mounting-type semiconductor packages, e.g., as can be mounted on the surface of the unit wiring substrate 140, may be used as the semiconductor package 130. A semiconductor chip in addition to the semiconductor package 130 may be directly mounted on the wiring substrate. In this case, a semiconductor device itself may serve as the semiconductor package.

The unit wiring substrate 140 is a multi-layer wiring substrate and includes a board body 141 and wiring pattern layers 144 formed on both surfaces of the board body 141. The board body 141 has a first surface 142 facing the outer-facing side surface 112 of the ground block 110. A second surface 143 of the board body 141, e.g., opposite the first surface 142, receives the semiconductor package 130. The wiring pattern layer 144 includes a first wiring layer formed on the first surface 142 and a second wiring layer formed on the second surface 143. The first wiring layer has ground pads 145 connected and grounded to the outer-facing side surface 112 of the ground block 110. The second wiring layer has board pads 146 to be connected to the bumps 132 of the semiconductor package 130, and has contact terminals 147 formed on the lower side of the second surface 143 and electrically connected to the board pads 146. As will be described later, the second wiring layer includes connection wires 149 to connect the semiconductor packages 130 of adjacent unit semiconductor devices 123.

In FIG. 3B, a board pad 146a connected to a grounding bump 132a of the semiconductor package 130 is electrically connected to a ground pad 145 through a via 148 penetrating the board body 141.

The unit wiring substrates 140 of the unit semiconductor packages 130 according to the Example 1 embodiment of the present invention may be formed in a single body.

The semiconductor device 120 has a structure in which four semiconductor packages 130 are mounted, e.g., at a predetermined intervals, on the second surface 143 of the wiring substrate 150 having, for example, a corresponding predetermined length. Thus, the wiring substrate 150 has a length corresponding to the circumferential length of a tetragonal section of the ground block 110.

A wiring substrate having sufficient flexibility to be bent at edges 113, e.g., between the outer-facing side surfaces 112 of the ground block 110, may be used as the wiring substrate 150. For example, in such case a tape wiring substrate is preferably used as the wiring substrate 150. The wiring substrate 150 is bent along, e.g., around, the outer-facing side surfaces 112 of the ground block 110. The first surface 142 of the wiring substrate 150 is connected and grounded to the outer-facing side surfaces 112 of the ground block 110. Connection wires 149, e.g., interconnecting the semiconductor packages 130, are formed on the wiring substrate 150.

If the wiring substrate 150 is folded and installed around the outer-facing side surfaces 112 of the ground block 110 as suggested, the edges 113 of the ground block 110 may be finished in a rounded shape to minimize bending of the wiring substrate 150 at the edges 113 of the ground block 110.

Figure 6A:
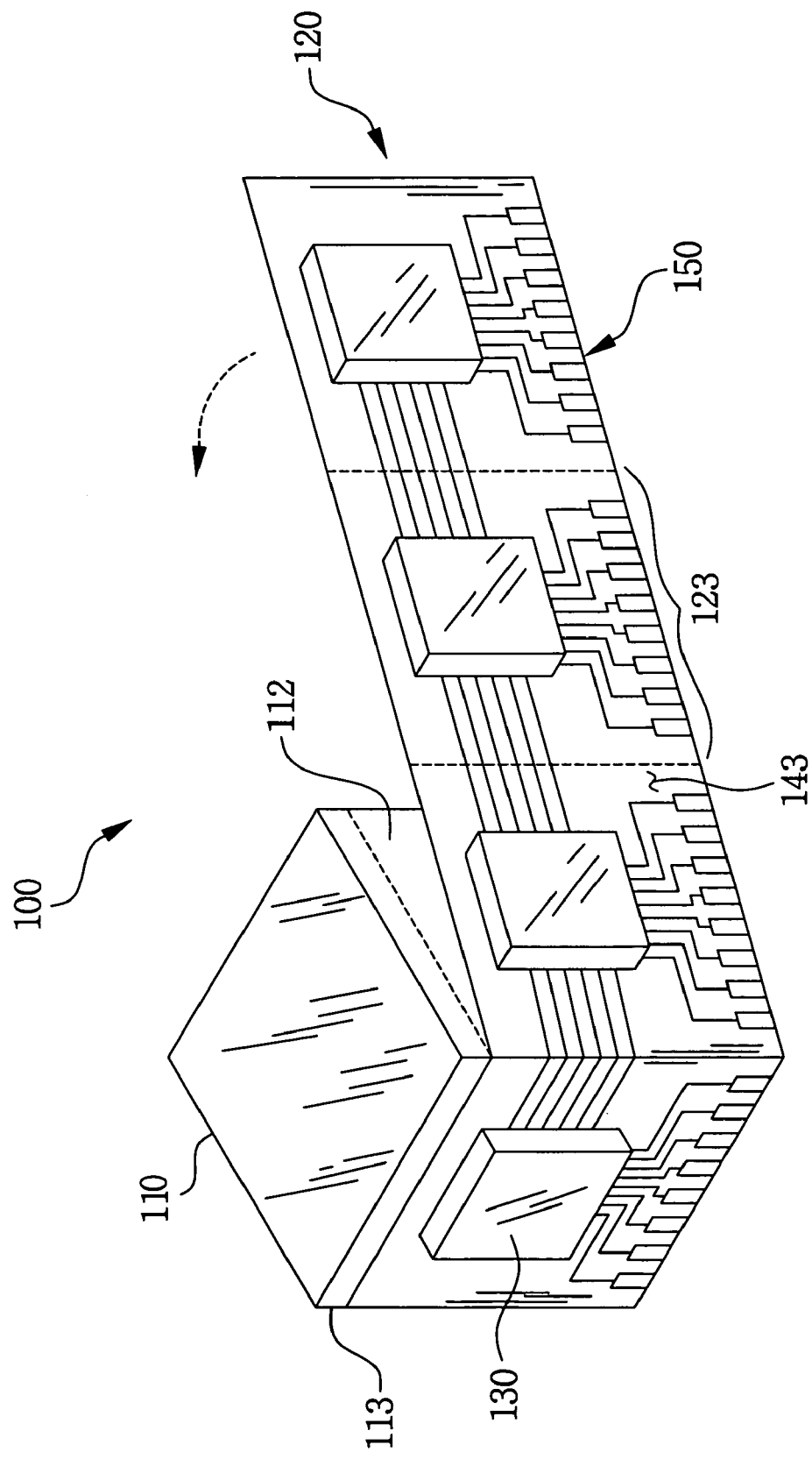
FIGS. 6A and 6B are perspective views showing steps of a manufacturing process of a three-dimensional semiconductor module having a ground block, according to the Example 1 embodiment of the present invention.
Figure 6B:
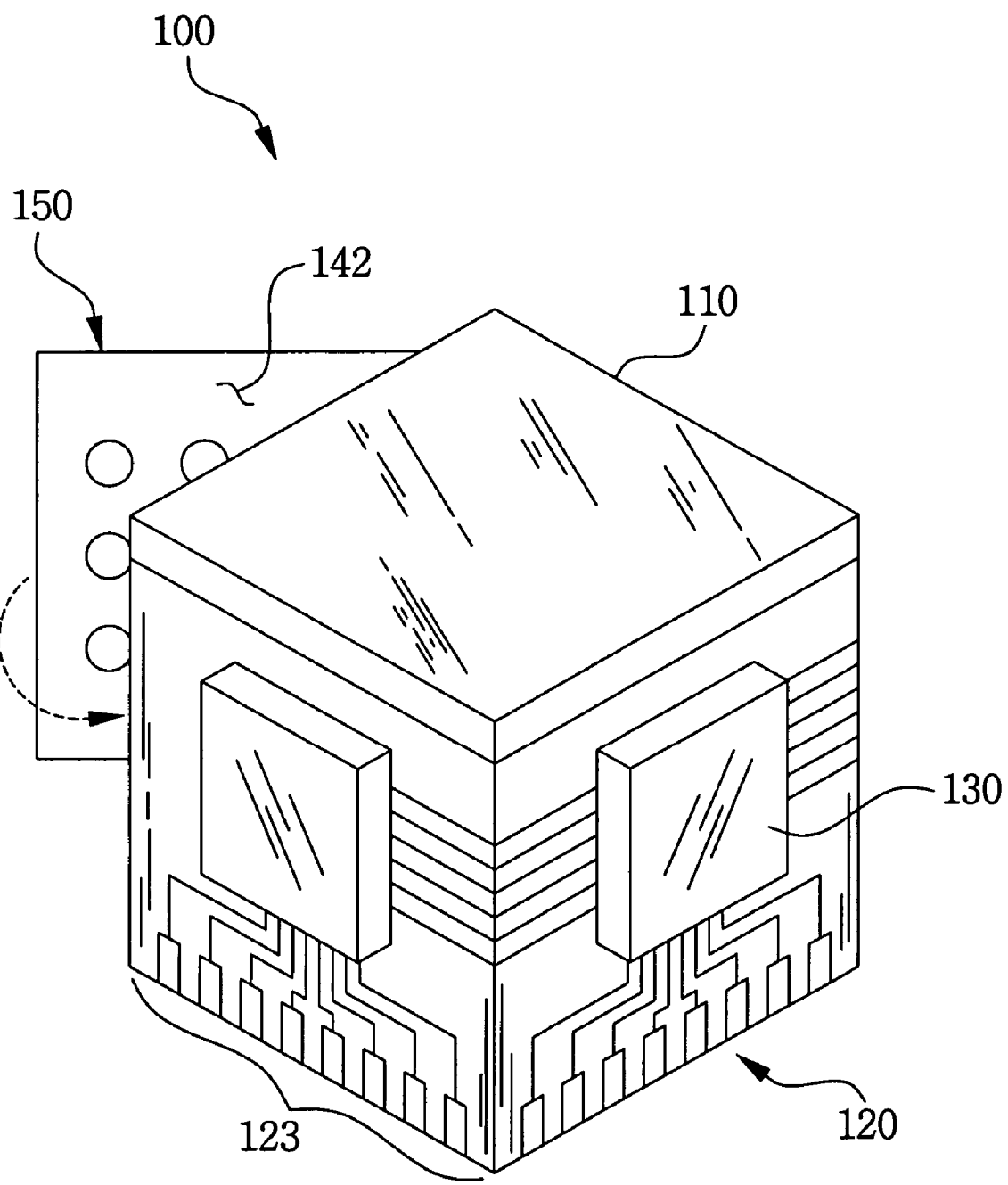

Hereinafter, a fabrication method of the three-dimensional semiconductor module according to the Example 1 embodiment of the present invention will be described with reference to FIGS. 2, 6A and 6B. In the state at which a ground block 110 and a semiconductor device 120 mounted with semiconductor packages 130 on the second surface 143 of the wiring substrate 150 are separately prepared, conductive adhesive is applied on the outer-facing side surfaces 112 of the ground block 110.

The first surface 142 of the wiring substrate 150 is attached to wrap or engage the outer-facing side surfaces 112 of the ground block 110. An edge of the wiring substrate 150 is placed on an edge 113 of the ground block 110 (FIG. 6A). Then the wiring substrate 150 is wrapped around and attached to the ground block 110. The semiconductor packages 130, e.g., as mounted on the wiring substrate 150, are placed on the outer-facing side surfaces 112 of the ground block 110 (FIG. 6B). The three-dimensional semiconductor module 100 as shown in FIG. 2 is thereby formed. Accordingly, each unit semiconductor device 123 may be disposed separately on each outer-facing side surface 112 of the ground block 110.

Ground pads 145 on the first surface 142 may be connected and grounded to the ground block 110 by way of the conductive adhesive. Conductive paste such as solder or Anisotropic Conductive Film (ACF) may be used as the conductive adhesive.

EXAMPLE 2

Although the three-dimensional semiconductor module according to the Example 1 embodiment of the present invention discloses a tetragonal pillar shape as the ground block, the invention need not be limited thereto. A variety of ground block shapes may be used including but not limited to multisided polygonal pillar shapes having non-parallel or non-coplanar outer-facing side surfaces such as a trigonal, pentagonal and hexagonal pillar shape. For example, a ground block 210 of an octagonal pillar shape is disclosed in FIG. 7.

Figure 7:
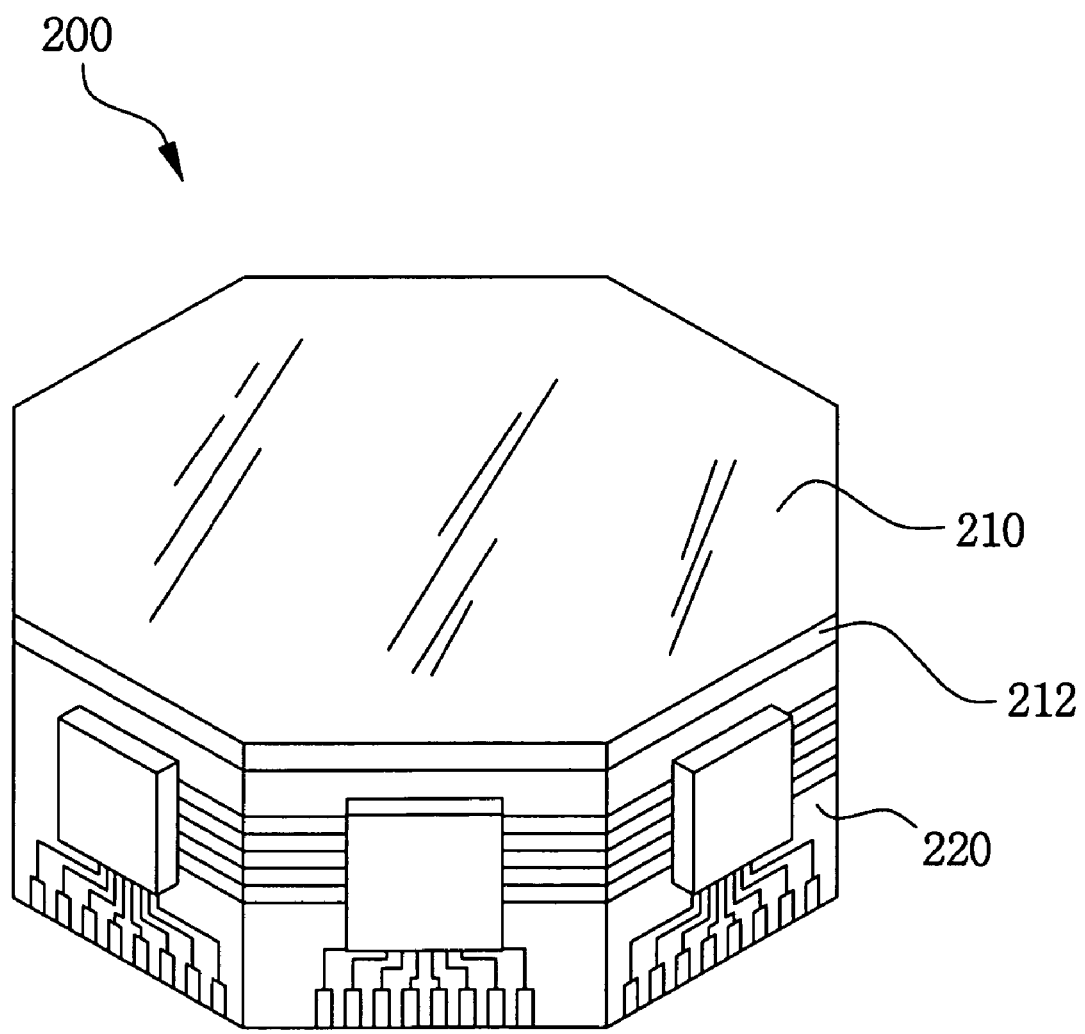
FIG. 7 is a perspective view showing a three-dimensional semiconductor module having a ground block, according to an Example 2 embodiment of the present invention.

Referring to FIG. 7, the three-dimensional semiconductor module 200 according to an Example 2 embodiment of the present invention has a similar configuration as the three-dimensional semiconductor module 100 of the Example 1 embodiment of the present invention. The three-dimensional semiconductor module 200, however, has a structure in which a semiconductor device 220 is connected and grounded to the outer-facing side surfaces 212 of the ground block 210 having an octagonal pillar shape. Therefore, the detailed explanation thereof will be omitted.

EXAMPLE 3

Figure 8:
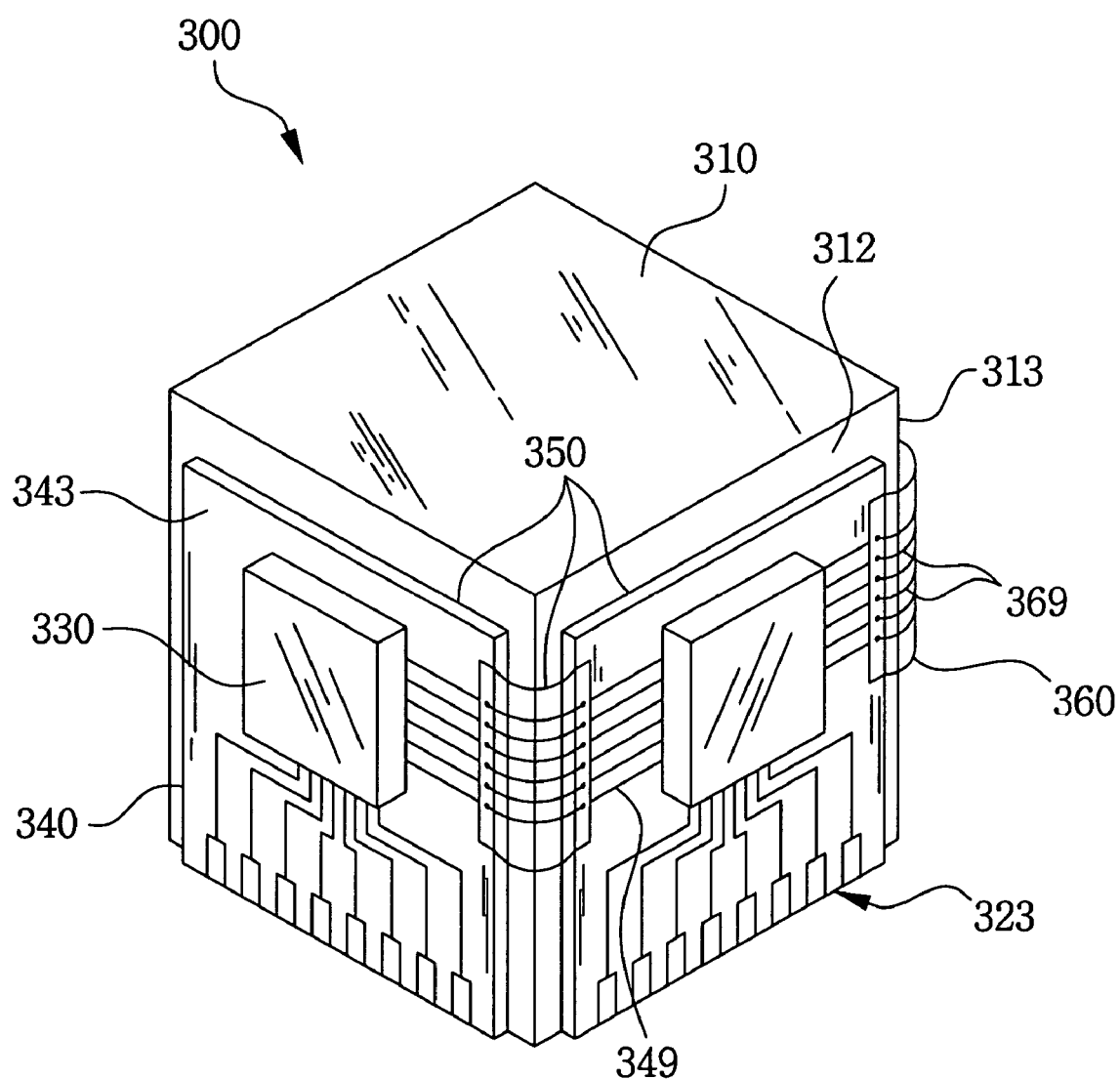
FIG. 8 is a perspective view showing a three-dimensional semiconductor module having a ground block, according to an Example 3 embodiment of the present invention.

The three-dimensional semiconductor modules according to the Examples 1 and 2 embodiments of the present invention disclose a tape wiring substrate of a single body type used as the wiring substrate. As shown in FIG. 8, however, a wiring substrate 350 having unit wiring substrates 340 (hereinafter referred to as "a first wiring substrate") connected by a connection substrate 360 (hereinafter referred to as "a second wiring substrate") may be used.

Referring to FIG. 8, a three-dimensional semiconductor module 300 according to an Example 3 embodiment of the present invention has a structure in which a unit semiconductor device 323 is mounted on an outer-facing side surface 312 of a ground block 310 and the first wiring substrates 340 are connected by the second wiring substrates 360.

A wiring substrate made of a relatively harder or more rigid material may be used as the first wiring substrate 340 because the first wiring substrate 340 is disposed on the planar outer-facing side surface 312 of the ground block 310. For example, a printed circuit board, ceramic board or silicon board may be used as the first wiring substrate 340.

A wiring substrate having relatively greater flexibility is preferably used as the second wiring substrate 360, so that the wiring substrate 360 may be bent easily at an edge 313 of the ground block 310 to connect the first wiring substrates 340 adjacent to the edge 313. For example, in such case a tape wiring substrate is preferably used as the second wiring substrate 360.

Connection wirings 369 (hereinafter referred to as "second connection wirings") connecting semiconductor packages 330 of adjacent unit semiconductor devices 323 to each other are formed on the second wiring substrate 360. Namely, the second connection wirings 369 connect connection wirings 349 (hereinafter referred to as "first connection wirings") formed on the adjacent first wiring substrates 340 to each other.

The second wiring substrate 360 may be connected to a first surface or to a second surface 343 of the adjacent first wiring substrates 340. In the Example 3 embodiment of the present invention, the second wiring substrate 360 is connected to the second surface 343 in order to connect the first connection wirings 349 formed on the second surface 343 of the adjacent first wiring substrates 340. Alternatively, in the case that the second wiring substrate is connected to the first surfaces of the first wiring substrates adjacent to each other, an end part of the first connection wirings may be formed on an edge of the first surface of the first wiring substrate adjacent to an edge of the ground block. For example, the end part of the first connection wirings to couple the first connection wirings formed on the second surface with a connection substrate at the edge of the first surface through a via may be formed.

EXAMPLE 4

Figure 9:
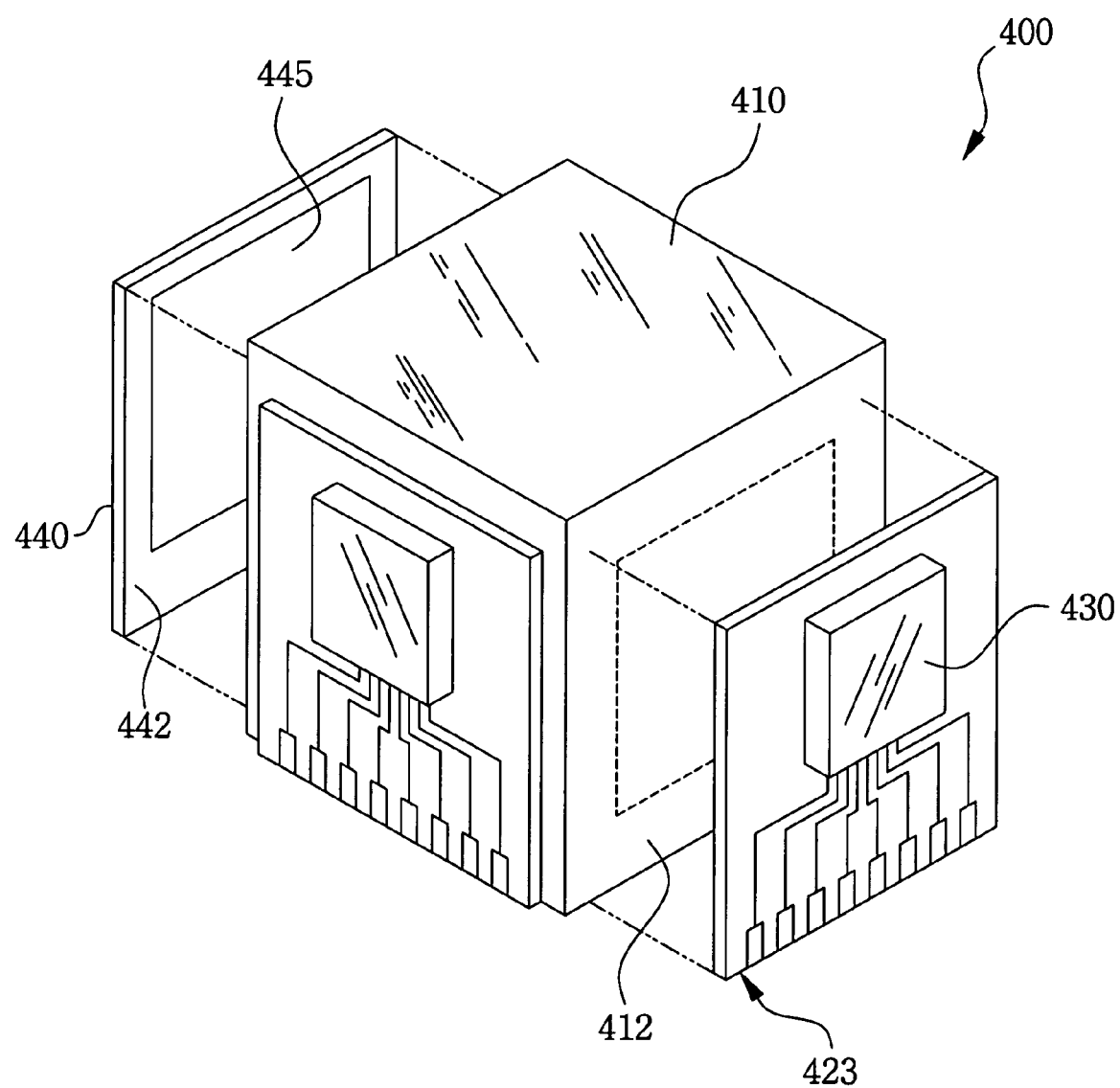
FIG. 9 is an exploded perspective view showing a three-dimensional semiconductor module having a ground block, according to an Example 4 embodiment of the present invention.

A wiring substrate of a strip shape is used to electrically connect semiconductor packages in the Examples 1 and 2 embodiments of the present invention. In the case where electrical connection between semiconductor packages 430 is not required, however, a three-dimensional semiconductor module 400 according to an Example 4 embodiment of the present invention may be configured by mounting a unit semiconductor package 423 on an outer-facing side surface 412 of a ground block 410 independently, e.g., as shown in FIG. 9.

A ground pad 445 of a plate shape is formed on the first surface 442 of a unit wiring substrate 440. As described in the Example 1 embodiment, however, a plurality of ground pads may be formed in a lattice array. Ground inductance is reduced and heat transfer efficiency increases as the contact area between the ground block 410 and the ground pad 445 of the unit wiring substrate 440 increases. Therefore, it is preferable, when possible, to form the ground pad 445 as a plate shape having a large contact area.

EXAMPLES 5 and 6

Three-dimensional semiconductor modules according to the Examples 1 to 4 embodiments of the present invention externally dissipate heat generated by a semiconductor device through the bottom and upper surfaces of the ground block. To further improve heat dissipation characteristics, heat dissipation members may be installed, e.g., on the upper surface of the ground block as shown in FIGS. 10 and 11.

Figure 10:
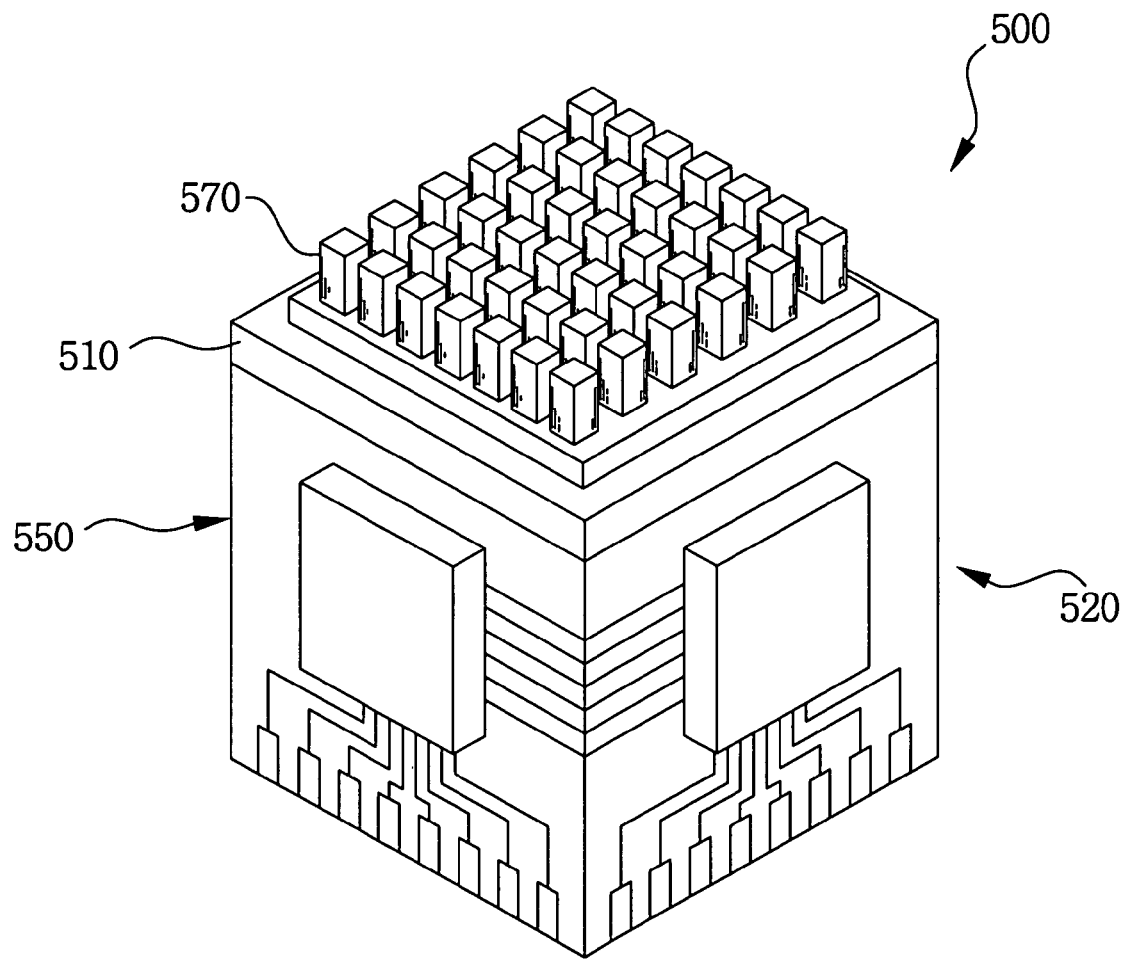
FIG. 10 is a perspective view showing a three-dimensional semiconductor module having a ground block, including a heat dissipation plate, according to and Example 5 embodiment of the present invention.

For example, as shown in FIG. 10, a three-dimensional semiconductor module 500 according to an Example 5 embodiment of the present invention includes a heat dissipation plate 570 installed on the upper surface of a ground block 510. Heat generated by operation of a semiconductor device 520 is transferred to the ground block 510 through a ground pad of a wiring substrate 550. The heat transferred to the ground block 510 is dissipated externally through the heat dissipation plate 570. The heat transferred to the ground block 510 is also dissipated from the bottom thereof, e.g., through a ground terminal of the ground block 510.

Figure 11:
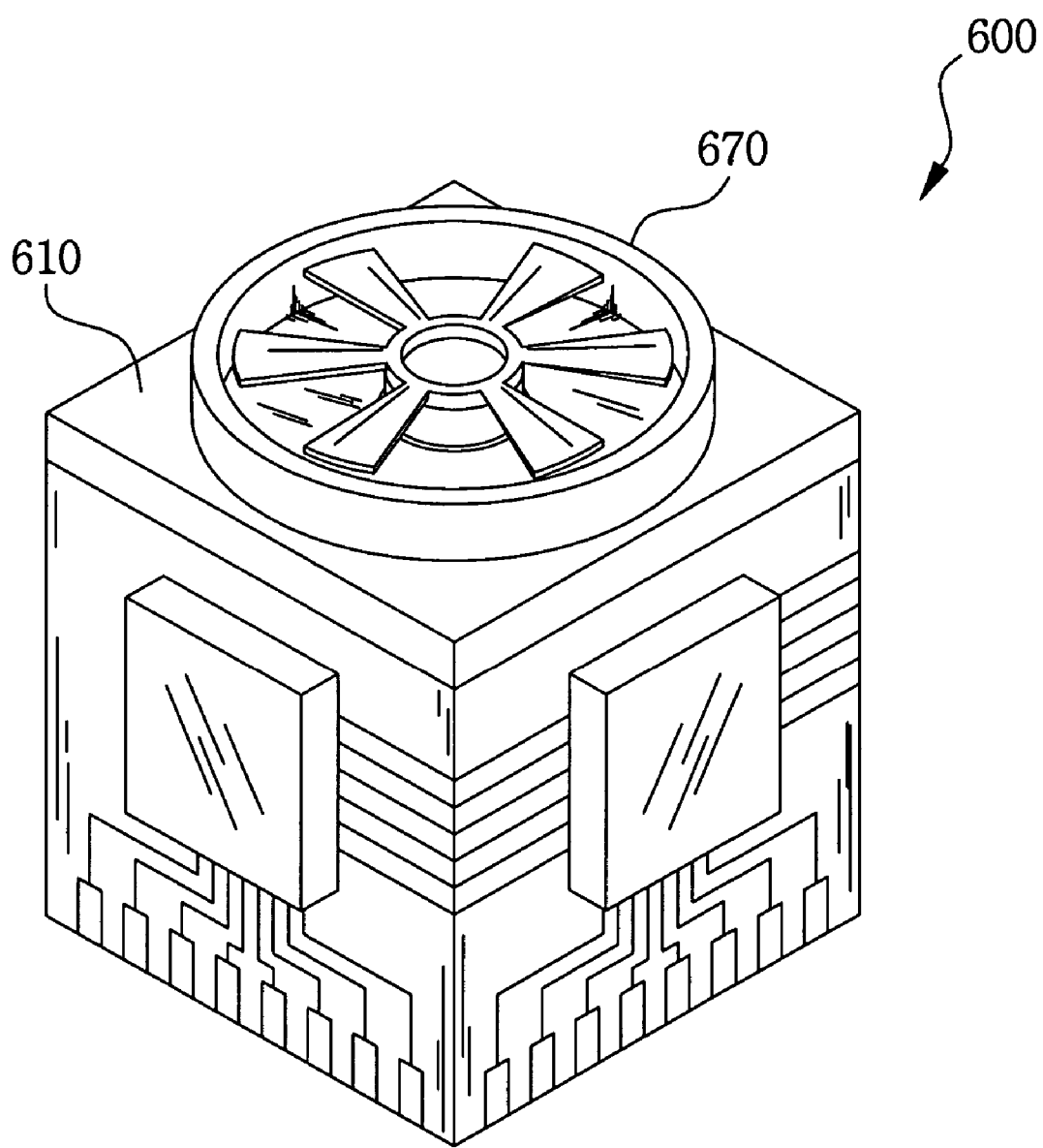
FIG. 11 is a perspective view showing a three-dimensional semiconductor module having a ground block, including a heat dissipation fan, according to an Example 6 embodiment of the present invention.

As shown in FIG. 11, a three-dimensional semiconductor module 600 according to an Example 6 embodiment of the present invention includes a heat dissipation fan 670 installed on the upper surface of a ground block 610.

APPLICATION EXAMPLE

Figure 12:
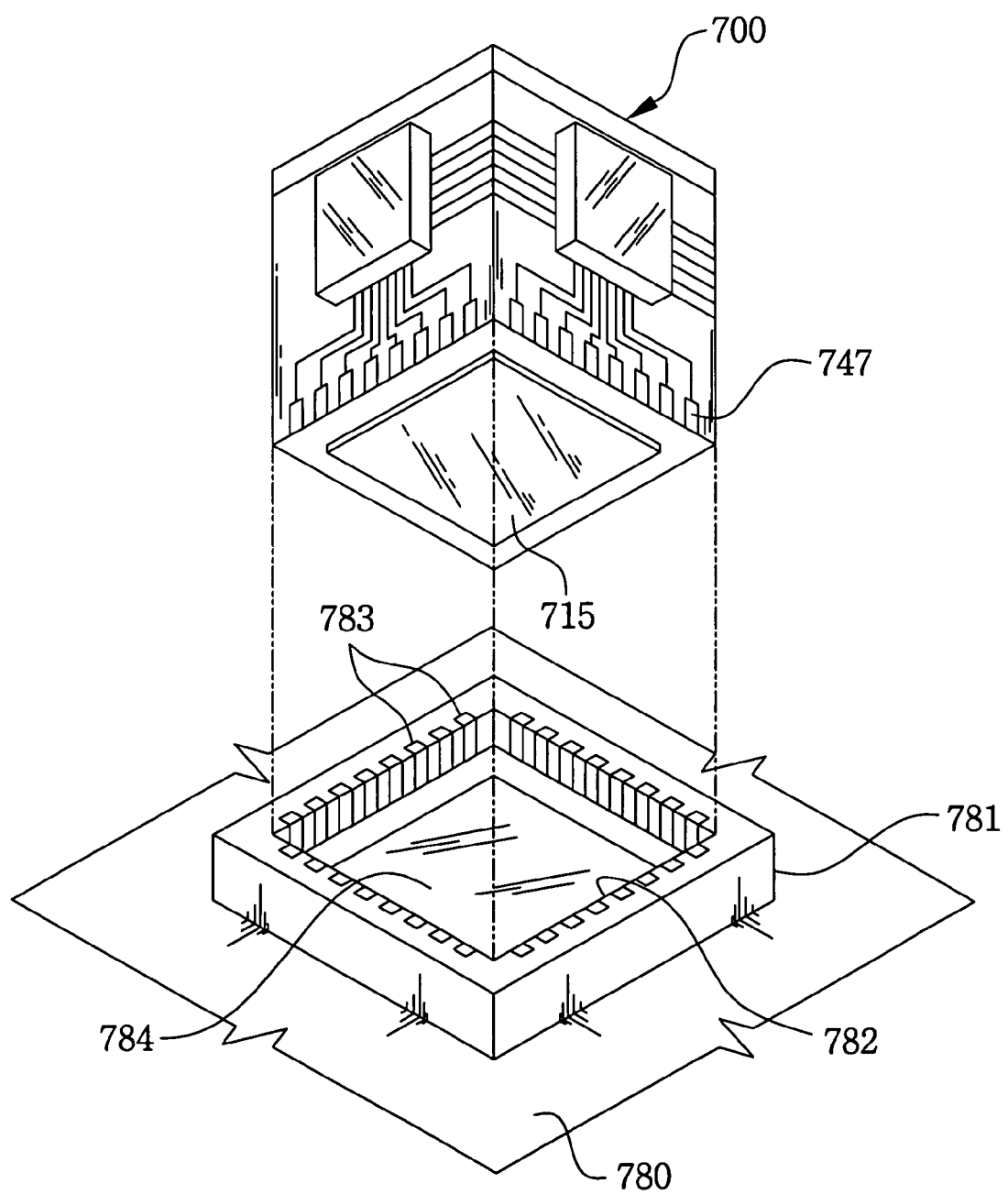
FIG. 12 is a view showing the state at which a three-dimensional semiconductor module having a multi-sided ground block, according to an embodiment of the present invention, is mounted on a motherboard.

A three-dimensional semiconductor module 700 according to the Examples 1 to 6 embodiments of the present invention may be inserted into a socket 781 of a motherboard 780, e.g., as shown in FIG. 12. An insertion space 782, corresponding to the shape of the three-dimensional semiconductor module 700, is formed in the socket 781. Socket pins 783 contact and electrically connect with contact terminals 747 of the three-dimensional semiconductor module 700, e.g., as formed in the inner side surface of the insertion space 782. A ground pad 784 is formed on the bottom surface of the insertion space 782 to connect to a ground terminal 715 of the three-dimensional semiconductor module 700. For example, the socket 781 may be fabricated with the insertion space 782 formed as a rectangular shape in the center thereof, such as where the three-dimensional semiconductor module 700 is a rectangular pillar shape.

Accordingly, by inserting the three-dimensional semiconductor module 700 into the socket 781, e.g., as formed with the contact terminals 747, the contact terminals 747 contact and are electrically connected to the socket pins 783 and the ground terminal 715 contacts and is grounded to the ground pad 784 of the motherboard 780.

Accordingly, a three-dimensional semiconductor module according to embodiments of the present invention has a structure in which each unit semiconductor device is grounded to a surface of a multisided ground block. The ground block provides the unit semiconductor devices with a stable ground path, and may thereby improve electrical characteristics of the three-dimensional semiconductor module by improving noise characteristics.

Because the three-dimensional semiconductor module according to embodiments the present invention has a structure in which each unit semiconductor device is grounded to a surface of the multisided ground block, the three-dimensional semiconductor module may be configured without bending of a semiconductor package (or semiconductor chip).

Heat dissipation characteristics of the three-dimensional semiconductor device may be improved because the ground block may be fabricated with a metal material having good thermal conductivity. Especially excellent heat dissipation characteristics may be secured by additionally installing a heat dissipation member on the upper surface of the ground block.

Although the invention has been described in detail herein, it should be understood that the invention is not limited to the embodiments herein disclosed. Various changes, substitutions and modifications may be made thereto by those skilled in the art without departing from the scope and spirit of the invention as disclosed in the accompanying claims.

What is claimed is:

1. A three-dimensional semiconductor module, the module comprising:
   a multisided ground block including outer-facing side surfaces; and
   a semiconductor device supported by and grounded to the outer-facing side surfaces of the ground block, the semiconductor device including semiconductor units and a wiring substrate, the wiring substrate having ground pads and having contact terminals to connect externally, the ground pads being electrically connectable to the outer-facing side surfaces of the ground block and formed on a first surface of the wiring substrate, the semiconductor units being mountable on a second surface of the wiring substrate opposite to the first surface of the wiring substrate, and the contact terminals being formed on a lower side of the second surface of the wiring substrate to externally connect and to connect to the semiconductor units.

2. The module of claim 1, wherein the outer-facing side surfaces comprise at least two planar surfaces in non-parallel relation.

3. The module of claim 1, wherein the outer-facing side surfaces comprises at least three planar surfaces in non-coplanar relation.

4. The module of claim 1, wherein the ground block is a metal material having sufficient electrical and thermal conductivity to electrically ground and to carry heat energy relative to the semiconductor units.

5. The module of claim 1, wherein a ground terminal is formed on a bottom surface of the ground block.

6. The module of claim 1, wherein the module further includes a heat dissipation member installable on an upper surface of the ground block.

7. The module of claim 1, wherein the wiring substrate has a length corresponding to a circumferential length of the ground block and is bendable around the outer-facing side surfaces of the ground block.

8. The module of claim 7, wherein the wiring substrate is a tape wiring substrate.

9. The module of claim 8, further comprising connection wirings to interconnect connect adjacent ones of the semiconductor units.

10. The module of claim 7, wherein the wiring substrate includes first wiring substrate portions and second wiring substrate portions, the first wiring substrate portions being made of a first material and disposed on the outer-facing side surfaces of the ground block, the second wiring substrate portion being made of a second material more flexible than the first material and being bendable at edges between the outer-facing side surfaces of the ground block to interconnect adjacent ones of first wiring substrate portions.

11. The module of claim 10, wherein the first wiring substrate portions include at least one of a printed circuit board, ceramic board, and a silicon board.

12. The module of claim 10, wherein the second wiring substrate portions include a tape wiring substrate.

13. The module of claim 10, wherein the ground pads are formed on a first surface of the first wiring substrate portions.

14. The module of claim 13, wherein the semiconductor units are mountable on a second surface of the first wiring substrate portions.

15. A semiconductor module, the module comprising:
a ground block having at least two planar surfaces in non-coplanar relation; and
a semiconductor device mountable and electrically connectable to the ground block, the semiconductor device including at least two semiconductor units each mountable and electrically connectable to a corresponding one of the at least two surfaces of the ground block, and including contact terminals to externally connect the semiconductor units and disposed adjacent to a bottom surface of the ground block.

16. The module of claim 15, wherein at least one of the at least two semiconductor units comprises a semiconductor chip and a unit wiring substrate with ground pads of the unit wiring substrate being connectable to at least one of the planar surfaces of the ground block, the ground pads being formed on a first surface of the unit wiring substrate, the semiconductor chip being mountable on a second surface of the unit wiring substrate opposite to the first surface thereof, the contact terminals being formed on the second surface of the unit wiring substrate and electrically connectable to the semiconductor chip.

17. The module of claim 16, wherein the unit wiring substrate of the semiconductor device comprises a single body having sufficient flexibility bend at portions corresponding to edges between adjacent ones of the outer-facing side surfaces of the ground block.

18. The module of claim 17, further comprising connection wirings to interconnect the semiconductor units are formed on the second surface of the unit wiring substrate.

19. The module of claim 15, further comprising a connection substrate bent at an edge of the two adjacent outer-facing side surfaces of the ground block to connect adjacent unit wiring substrates.

20. The module of claim 19, wherein the connection substrate comprises a tape wiring substrate.

21. The module of claim 20, wherein the unit wiring substrate comprises at least one of a printed circuit board, ceramic board, and a silicon board.

22. The module of claim 15, wherein a first one of the semiconductor units is installed on a selected one of the outer-facing side surfaces of the ground block independently of a second one of the semiconductor units.

23. The module of claim 15, wherein the ground block is a metal material having sufficient electrical and thermal conductivity to supply ground potential and conduct heat energy relative to the semiconductor units.

24. The module of claim 15, wherein a ground terminal is formed on a bottom surface of the ground block.

25. The module of claim 15, further comprising a heat dissipation member installed on an upper surface of the ground block.

26. A semiconductor module, the module comprising:
an electrically conductive ground block having at least two surfaces, the at least two surfaces being planar surfaces in non-parallel relation; and
a semiconductor device supported by the ground block and having at least two semiconductor units to connect and ground to the at least two surfaces of the ground block, the semiconductor device including a wiring substrate having ground pads to connect to the ground block and having contact terminals to connect externally.

27. The module of claim 26, wherein the ground pads are formed on a first surface of the wiring substrate, the semiconductor units are mounted on a second surface of the wiring substrate opposite the first surface of the wiring substrate, and the contact terminals are formed on a lower side of the second surface of the wiring substrate to connect externally and to connect to the semiconductor units.

28. The module of claim 26, further comprising a ground terminal formed on a bottom surface of the ground block.

29. The module of claim 26, further comprising a heat dissipation member installable on an upper surface of the ground block.

30. The module of claim 26, wherein the wiring substrate has a length corresponding to a circumferential length of the ground block and surrounds a plurality of outer-facing side surfaces of the ground block including the at least two surfaces of the ground block, and the ground pads on the first surface of the wiring substrate and are connectable to the outer-facing side surfaces of the ground block.

31. The module of claim 30, wherein the wiring substrate includes first wiring substrate portions and second wiring substrate portions, the first wiring substrate portions being made of a given material and disposed on the at least two surfaces of the ground block, the second wiring substrate portions being made of a material relatively more flexible than the given material, bendable at edges between the outer-facing side surfaces of the ground block, and formed to connect adjacent ones of the first wiring substrate portions.

32. The module of claim 31, wherein the ground pads are formed on a first surface of the first wiring substrate portions.

33. The module of claim 31, wherein the semiconductor units are mounted on second surface of the first wiring substrate portions.

* * * * *

UNITED STATES PATENT AND TRADEMARK OFFICE
CERTIFICATE OF CORRECTION

| | | |
|---|---|---|
| PATENT NO. | : 7,508,061 B2 | Page 1 of 1 |
| APPLICATION NO. | : 11/369444 | |
| DATED | : March 24, 2009 | |
| INVENTOR(S) | : Sun-Won Kang et al. | |

It is certified that error appears in the above-identified patent and that said Letters Patent is hereby corrected as shown below:

Title page item 57 Abstract, line 3, the word "multi-side" should read -- multi-sided --;
Column 10, line 46, the words "pads on the" should read -- pads are formed on a --.

Signed and Sealed this

Eighth Day of December, 2009

David J. Kappos
*Director of the United States Patent and Trademark Office*